US009877415B2

(12) United States Patent
Szeremeta et al.

(10) Patent No.: US 9,877,415 B2
(45) Date of Patent: Jan. 23, 2018

(54) COLD STORAGE SERVER WITH HEAT DISSIPATION

(71) Applicant: Western Digital Technologies, Inc., Irvine, CA (US)

(72) Inventors: Wojciech Szeremeta, Mission Viejo, CA (US); Robert P. Ryan, Mission Viejo, CA (US)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 15/195,806

(22) Filed: Jun. 28, 2016

(65) Prior Publication Data
US 2017/0265335 A1   Sep. 14, 2017

Related U.S. Application Data

(60) Provisional application No. 62/305,484, filed on Mar. 8, 2016.

(51) Int. Cl.
*H05K 7/20* (2006.01)
*G06F 1/18* (2006.01)
*H05K 7/14* (2006.01)

(52) U.S. Cl.
CPC ......... *H05K 7/20736* (2013.01); *G06F 1/187* (2013.01); *H05K 7/1439* (2013.01); *H05K 7/1489* (2013.01)

(58) Field of Classification Search
CPC ...... G06F 1/187; G06F 1/20; G06F 2200/201; G11B 33/128; G11B 33/142; H05K 7/20727; H05K 7/20145; H05K 7/20736; H05K 7/20545; H05K 7/20581; H05K 7/1439; H05K 7/1489
See application file for complete search history.

(56) References Cited

U.S. PATENT DOCUMENTS

| 5,414,591 | A | * | 5/1995 | Kimura | ..................... G06F 1/20 361/679.33 |
|---|---|---|---|---|---|
| 5,477,416 | A | * | 12/1995 | Schkrohowsky | .. H05K 7/20563 361/695 |
| 6,480,380 | B1 | | 11/2002 | French et al. | |
| 6,556,438 | B1 | | 4/2003 | Bolognia et al. | |
| 6,567,271 | B2 | * | 5/2003 | Stone | ..................... G06F 1/184 361/724 |
| 6,574,100 | B1 | | 6/2003 | Anderson | |

(Continued)

FOREIGN PATENT DOCUMENTS

JP   2003-323789   11/2003

OTHER PUBLICATIONS

"Business Storage 8-bay Rackmount NAS," Technology paper, www.Seagate.com, Jan. 1, 2014, pp. 1-3.
(Continued)

*Primary Examiner* — James Wu
(74) *Attorney, Agent, or Firm* — Knobbe, Martens, Olson & Bear, LLP

(57) ABSTRACT

A server can be used for a cold storage application. The server can include a nest for holding a high density of bare storage drives. The nest can include a plurality of drive cooling channels residing on the underside of the nest. The server can further include rear, front, and side air flow paths for natural convection cooling.

20 Claims, 15 Drawing Sheets

(56) References Cited

U.S. PATENT DOCUMENTS

| | | | |
|---|---|---|---|
| 6,618,248 B1 | 9/2003 | Dalheimer | |
| 6,621,693 B1 * | 9/2003 | Potter | G06F 1/184 |
| | | | 257/E23.099 |
| 6,754,082 B1 * | 6/2004 | Ding | G11B 33/02 |
| | | | 312/223.1 |
| 7,079,390 B2 | 7/2006 | Barr et al. | |
| 7,495,906 B2 | 2/2009 | Fujie et al. | |
| 7,586,741 B2 * | 9/2009 | Matsushima | G06F 1/206 |
| | | | 361/679.46 |
| 7,660,107 B2 * | 2/2010 | Leung | G06F 1/187 |
| | | | 312/223.1 |
| 7,701,705 B1 | 4/2010 | Szeremeta | |
| 7,703,291 B2 * | 4/2010 | Bushnik | G01D 3/08 |
| | | | 62/259.2 |
| 8,064,194 B2 | 11/2011 | Szeremeta | |
| 8,113,873 B1 | 2/2012 | Sarraf | |
| 8,133,426 B1 | 3/2012 | Yurchenco et al. | |
| 8,358,395 B1 | 1/2013 | Szeremeta | |
| 8,417,979 B2 | 4/2013 | Maroney | |
| 8,451,600 B1 | 5/2013 | Ross | |
| 8,462,460 B1 | 6/2013 | Szeremeta et al. | |
| 8,498,088 B1 | 7/2013 | Klein | |
| 8,547,658 B1 | 10/2013 | Szeremeta | |
| 8,947,816 B1 | 2/2015 | Ryan et al. | |
| 9,060,425 B2 | 6/2015 | Yin et al. | |
| 9,443,560 B2 | 9/2016 | Szeremeta | |
| 2004/0172642 A1 | 9/2004 | Ding et al. | |
| 2005/0114876 A1 * | 5/2005 | Atarashi | G11B 33/1406 |
| | | | 720/649 |
| 2005/0162831 A1 | 7/2005 | Shum et al. | |
| 2006/0061955 A1 * | 3/2006 | Imblum | G06F 1/184 |
| | | | 361/679.33 |
| 2007/0053154 A1 * | 3/2007 | Fukuda | G11B 33/022 |
| | | | 361/679.33 |
| 2007/0247805 A1 * | 10/2007 | Fujie | G11B 33/12 |
| | | | 361/679.49 |
| 2010/0073868 A1 | 3/2010 | Mayer et al. | |
| 2011/0292602 A1 | 12/2011 | Narasimhan et al. | |
| 2012/0069514 A1 | 3/2012 | Ross | |
| 2013/0088823 A1 | 4/2013 | Yang | |
| 2013/0155599 A1 | 6/2013 | Ross et al. | |
| 2013/0210334 A1 | 8/2013 | Tan | |
| 2014/0376174 A1 * | 12/2014 | Dean | G06F 1/186 |
| | | | 361/679.46 |
| 2015/0026515 A1 | 1/2015 | Arnouse | |
| 2015/0192970 A1 | 7/2015 | Jau et al. | |

OTHER PUBLICATIONS

International Written Opinion in PCT Application No. PCT/US2015/056573, dated Jan. 28, 2016 in 8 pages.
International Search Report in PCT Application No. PCT/US2015/056573, dated Jan. 28, 2016 in 3 pages.
International Preliminary Report on Patentability in PCT Application No. PCT/US2015/056573, dated May 18, 2017 in 11 pages.
International Search Report in PCT Application No. PCT/US2017/020803, dated Jun. 5, 2017 in 6 pages.
International Written Opinion in PCT Application No. PCT/US2017/020803, dated Jun. 5, 2017 in 4 pages.

* cited by examiner

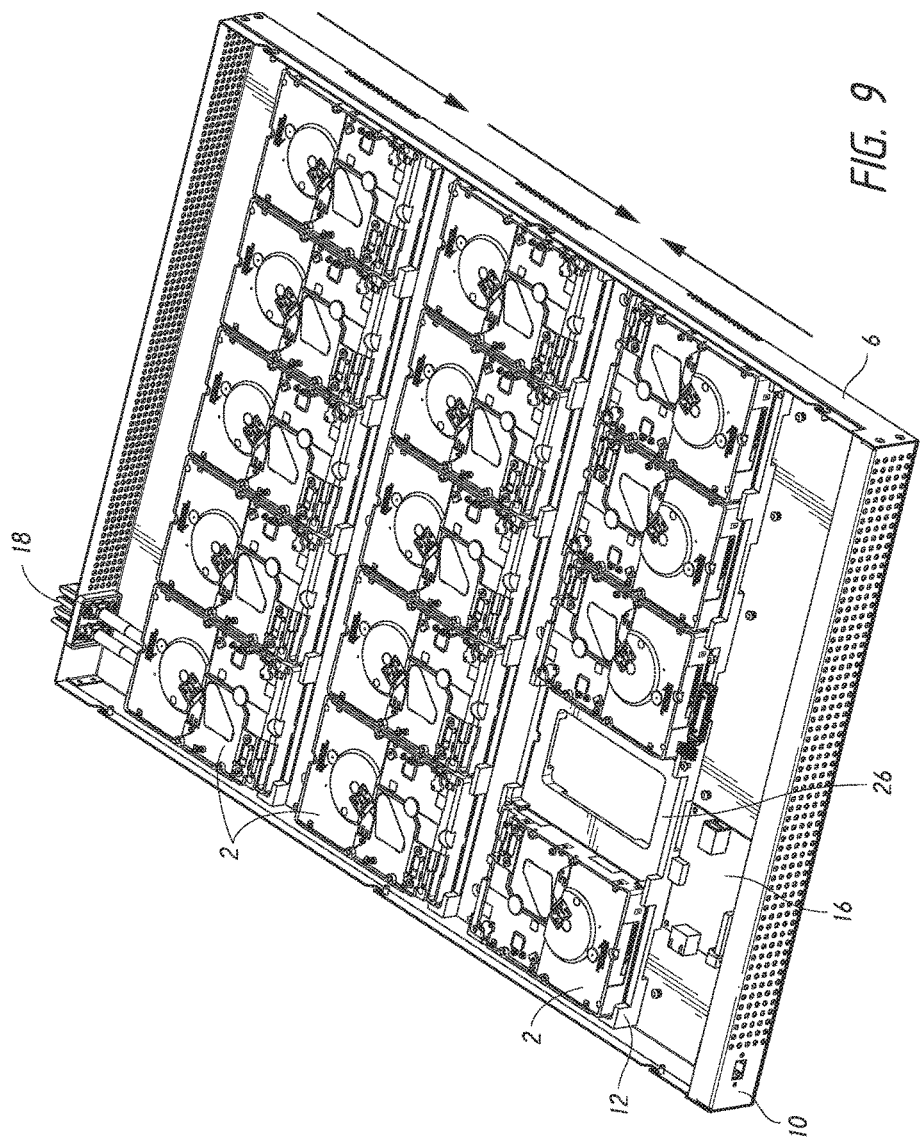

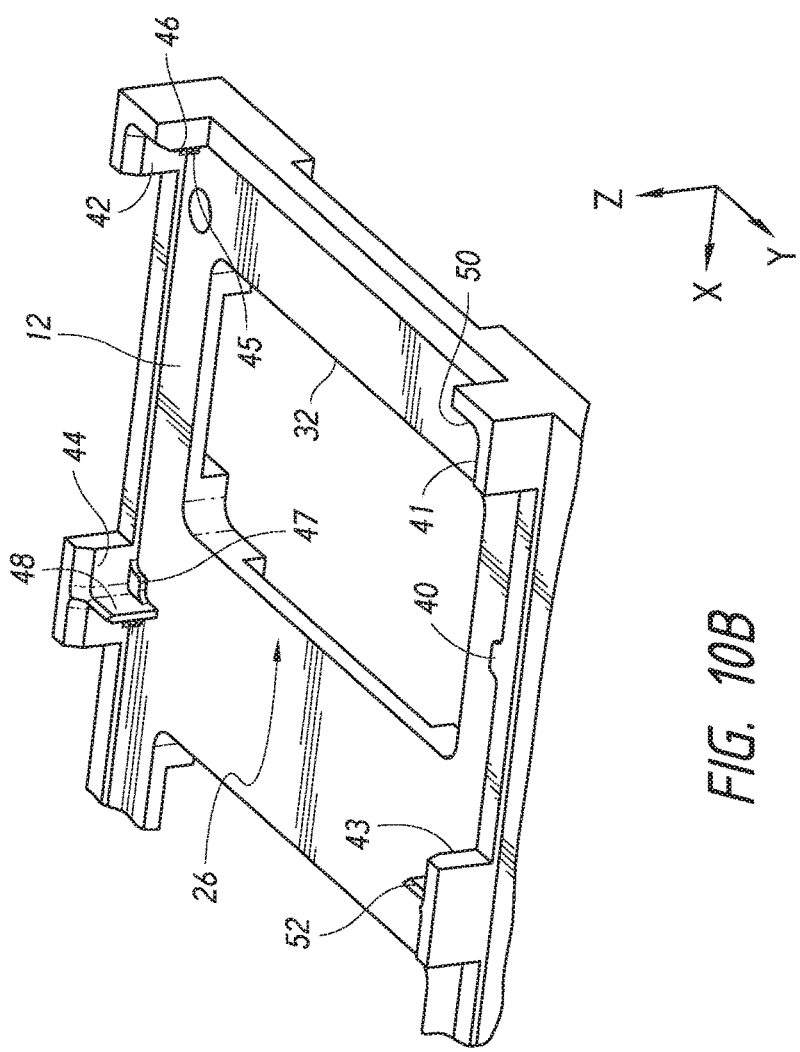
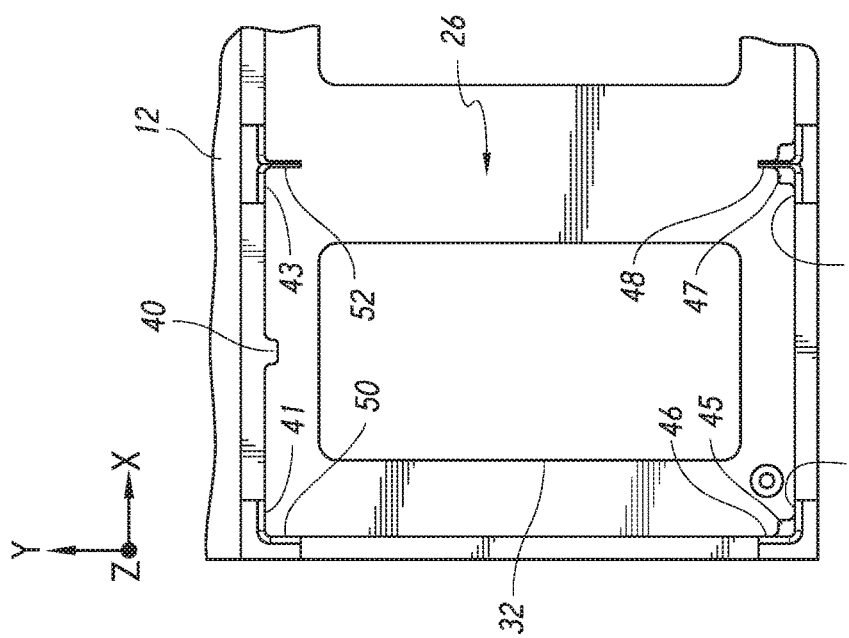
FIG. 10B
FIG. 10A

COLD STORAGE SERVER WITH HEAT DISSIPATION

CROSS-REFERENCE TO RELATED APPLICATIONS

This application claims the benefit of U.S. Provisional Patent Application No. 62/305,484, filed on Mar. 8, 2016, titled "COLD STORAGE SERVER," the entirety of which is incorporated by reference.

BACKGROUND

Technical Field

Certain embodiments disclosed herein relate generally to high density servers, such as rack mounted servers for cold storage of data.

Description of the Related Art

Rack mountable servers are generally shaped and sized based on industry standards. For example, a standard server-rack configuration (one rack unit or "1U") is 19 inches (480 mm) wide and 1.75 inches (44 mm) tall. The most common computer rack form-factor is 42U high, which can receive up to 42 discrete computer devices that are directly mountable in the rack.

To maximize storage capacity of certain servers, rack mountable or otherwise, disk drives are tightly packed side by side within an enclosure. A 1U server hosting either eight (8×) or twelve (12×) disk drives is an example of a densely packed storage server. Such a server has very little space for air movement between each disk drive. Thus, it will be understood that placing a large number of disk drives close together can introduce cooling issues.

BRIEF DESCRIPTION OF THE DRAWINGS

Various embodiments are depicted in the accompanying drawings for illustrative purposes, and should in no way be interpreted as limiting the scope of the inventions.

FIG. 9 is a top perspective view of a partially disassembled server illustrating the arrangement of storage drives within the server chassis.

FIGS. 10A and 10B illustrate datums of the nest.

FIGS. 13A-14 illustrate the securement of the storage drive retaining cover.

DETAILED DESCRIPTION

Figure 1:
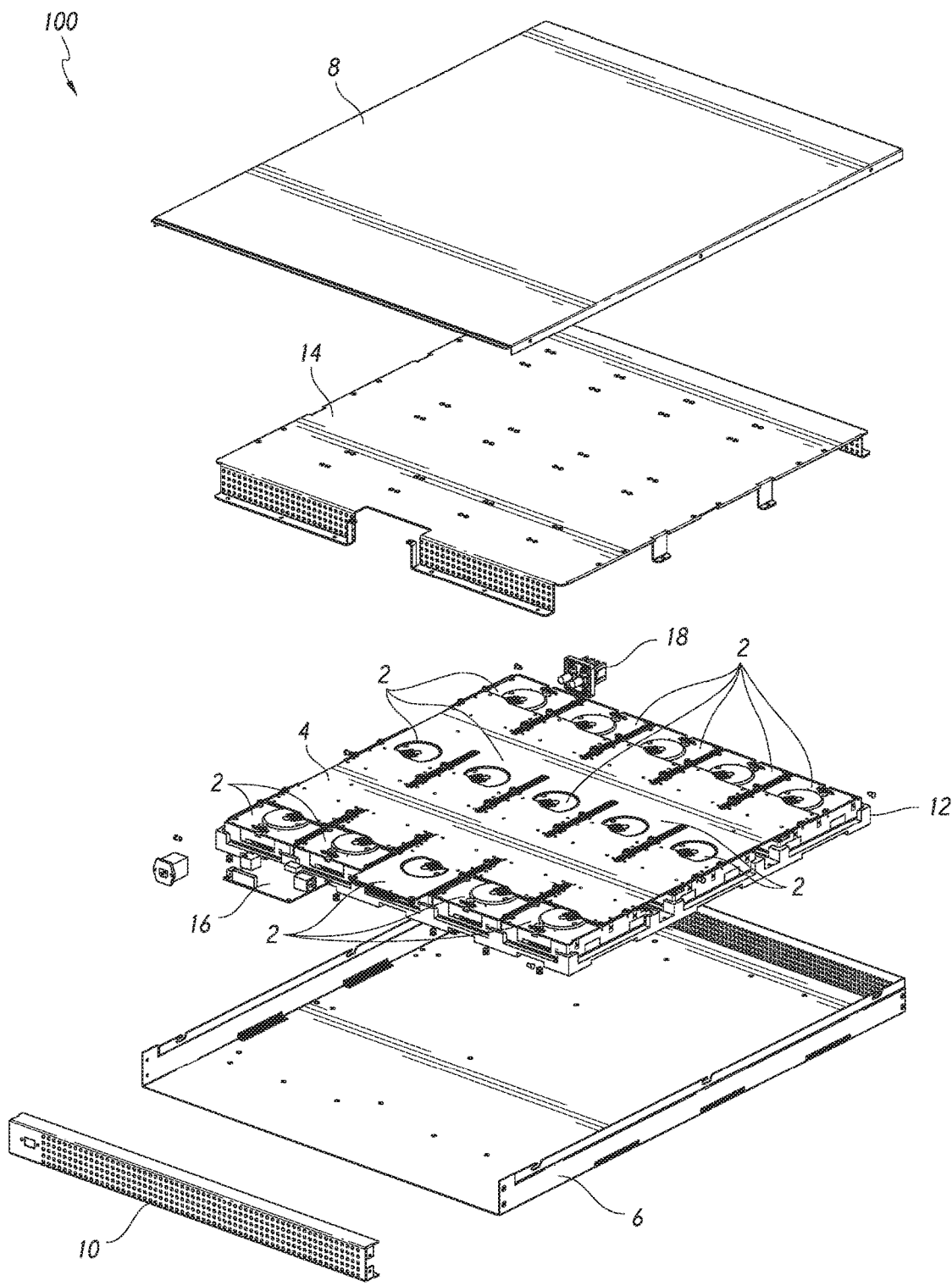
FIG. 1 shows an exploded view of certain chassis components of a server.

To maximize storage capacity of certain servers, storage drives are tightly packed side by side within an enclosure. Placing a large number of storage drives close together can introduce cooling issues. Many servers utilize forced convection cooling systems to remove the heat from disk drives and controlling electronics. Such cooling systems are designed to move a large volume of air across or throughout the server in order to remove the heat energy created by the operation of the server.

Effective air flow mass movement generally requires open spaces (low impedance) between and around storage drives and surrounding electronics throughout the server. At the same time, it is desirable to have size efficient enclosures where the volume and footprint of the enclosure are minimized as much as possible. In many cases, the necessity of open space limits the overall server storage density within a given volumetric space of the server.

A 1U server hosting either eight (8×) or twelve (12×) disk drives is an example of a densely packed storage server having very little space for air movement between each storage drive.

In some applications, servers are used for cold storage of data (e.g., data that is inactive for extended period of time). Cold storage data servers are typically used for backups, archiving, and multimedia applications. Cold storage is the retention of data that is accessed infrequently. For example, cold storage of data may include activating less than 5 to 10% of the disk drives at any one time during data access. Stated differently, during access of cold storage data, 90 to 95% of the disk drives remain inactive.

The servers can be placed in a refrigeration room to reduce the heat of the server, including generally reducing the need for fans (in the room, on the rack, on the server, etc.). Though room refrigeration can reduce the individual cooling needs for each server, high storage density can still create heating issues. A cold storage facility for cold storage servers can be an air conditioned room or free air room sufficient to cool the servers. A cold storage facility can use ice blocks to cool the servers.

As an example, the servers will preferably be high storage density servers containing data that is archived as it is rarely accessed. Such archive storage can include powering only a data storage device required for an active request for data. For example, the Open Compute specification calls for an Open Vault tray of fifteen (15×) data storage devices. One or a few data storage device(s) in the tray is powered at a time to reduce power, heat, and vibration. However, because one or a few data storage device(s) is powered at a time, the other inactive data storage devices may include components which are not simultaneously needed or utilized, and may therefore be redundant while consuming excess power.

One way in which heating issues of a high storage density server can be reduced is to connect multiple bare data storage devices to a common controller printed circuit board assembly (pcba). As used herein, bare data storage devices are data storage devices without a dedicated controller pcba. A bare data storage device can be a conventional drive, such as a hard disk drive (HDD), solid state drive (SSD), solid state hybrid drive (SSHD), a storage drive, or other storage device known in the art. Certain examples of a data storage assembly that can use a common controller pcba to control multiple bare data storage devices can be found in U.S. Pat. No. 8,947,816, incorporated by reference herein and made a part of this specification.

Looking now to FIG. 1, an exploded view of a server 100 is shown. The server 100 as shown has a high storage density, with fifteen (15) bare disk drives 2 connected to a single controller pcba 4. In the illustrated embodiment, the server 100 is a high density, cold storage server with a chassis design that can accommodate up to fifteen (15×) 3.5 inch form factor disk drives 2 inside the chassis. It will be understood that, in other embodiments, two or more bare storage drives 2 can be connected to a single controller pcba 4 within a chassis. The server 100 is preferably configured for cold storage use, though the principles discussed herein can also be applied to other applications.

The illustrated chassis form factor adheres to the Facebook Open Architecture Design Guidelines (21.12 inch (536.5 mm)×1.75 inch (44.5 mm)×27.39 inch (695.6 mm)), although a similar chassis architecture could be applied to a standard 1U form factor rackmount server (19.0 inches (480 mm)×1.75 inches (44.5 mm)×26.4 inch (670 mm)), but hosting twelve (12×) or sixteen (16×) 3.5 inch form factor drives. In addition, in some embodiments using an Open Architecture Design or a 1U (or 1U-like) form factor, up to 20 disk drives could be positioned within the server.

In some embodiments, the derived 1U chassis server design can be used to build a cold storage server and take advantage of disk drives with Shingle Magnetic Recording (SMR) drive technology. The SMR drive technology along with the capability to spin down and up an individual drive among many drives can be a very cost effective technology for cold storage applications.

As illustrated in FIG. 1, a server 100 can include a bottom chassis 6 (e.g., a bottom of the chassis), a chassis cover 8 (e.g., a top of the chassis) and a front cover or face plate 10. As will be understood, the server 100 can have any number of different chassis designs. The chassis can be an enclosed chassis as shown, but can also be open on the top, bottom, back, front, and/or on one or more of the sides. As shown, the server 100 also includes a nest 12 configured to receive and properly position the bare storage drives 2 within the server 100. Fifteen (15) bare disk drives 2 are shown, though a plurality of storage drives 2 that are the same or different, and that are bare or have dedicated pcbas could be included in the server.

The server 100 can be rack mountable (such as with additional hardware) or standalone. The server 100 can hold the storage drives 2 organized into rows and columns. Other configurations can also be used where the storage drives 2 do not need to be symmetrically organized or evenly spaced and positioned as in the illustrated embodiment.

A single controller pcba 4 is shown designed to control the fifteen (15) bare disk drives 2. A retaining cover 14 is also shown that can be used to secure the storage drives 2 in the server 100.

A computer module 16 is also shown. It will be understood that the server 100 can include any number of different features such as the computer module 16, but also one or more of a power supply, bus, fan, storage drive, printed circuit board(s) (central processing unit (CPU), input/output (I/O) board, memory modules), etc.

Figure 2:
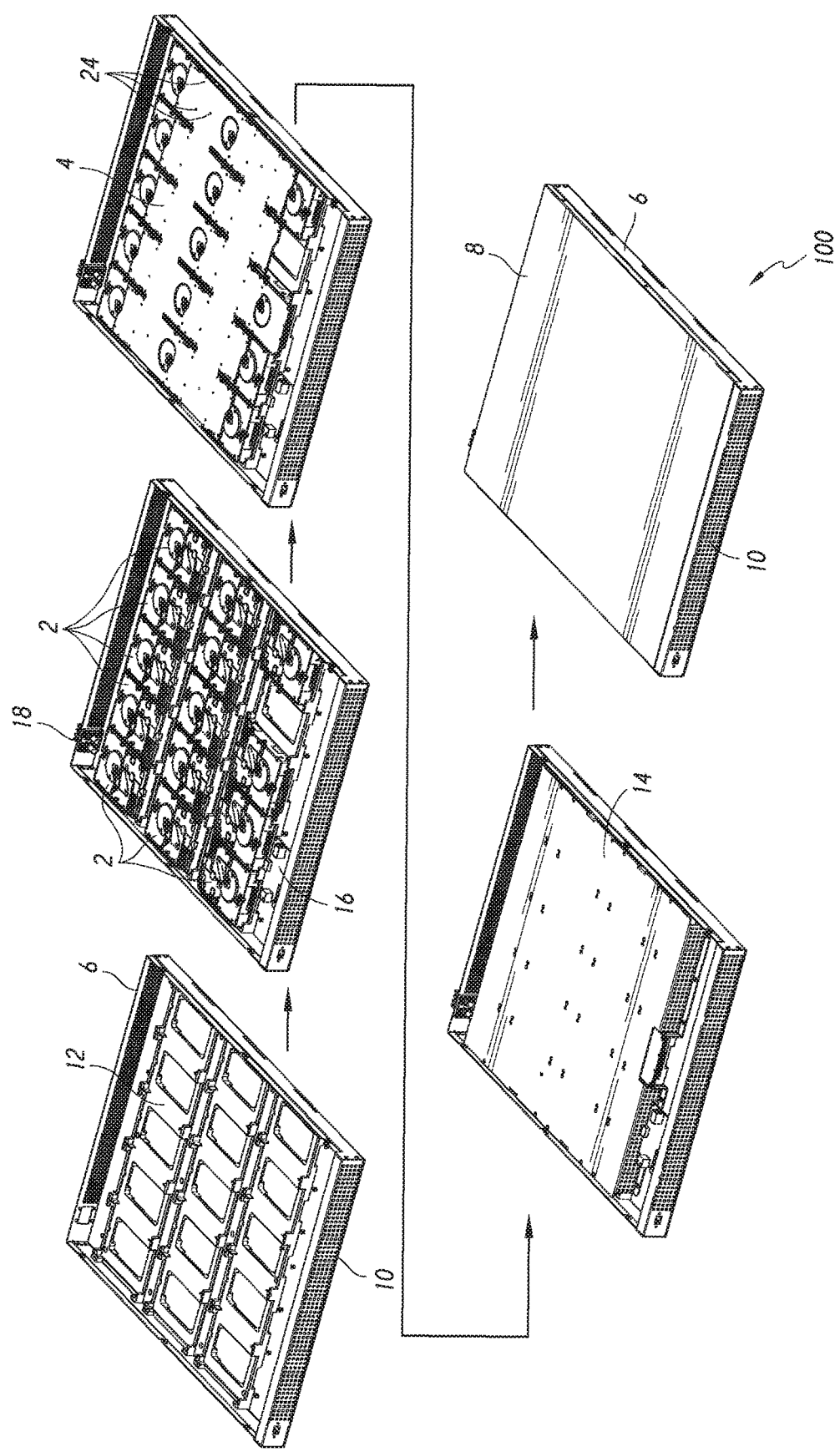
FIG. 2 illustrates an assembly procedure of the server.
Figure 2A:
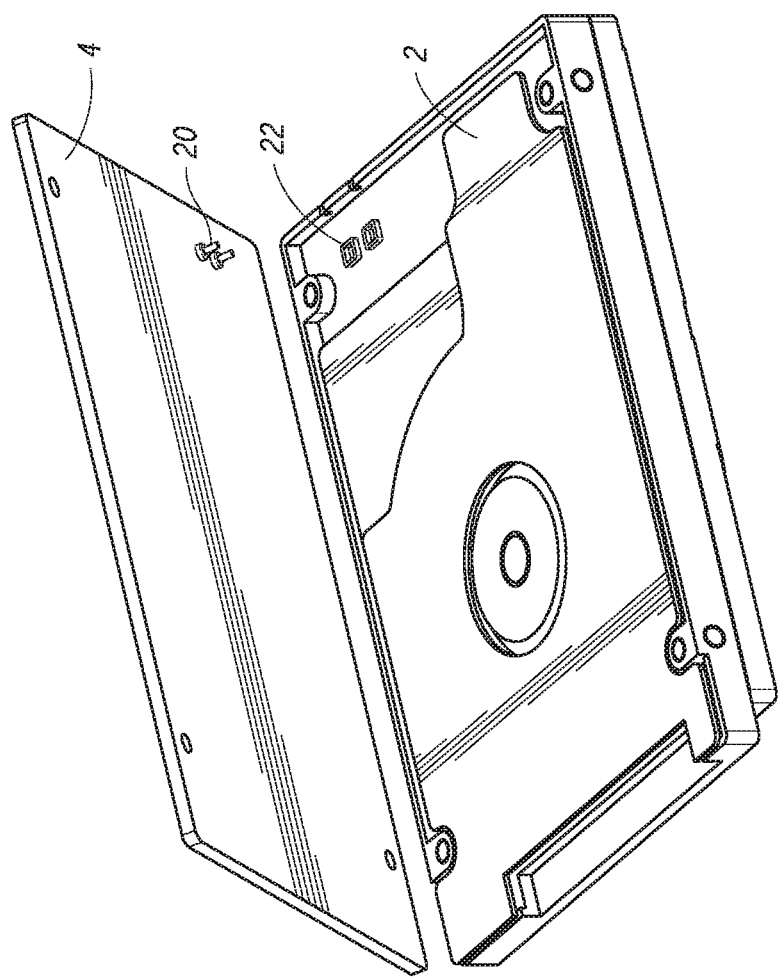
FIG. 2A shows a detail view of a storage drive and a portion of printed circuit board.

Looking to FIG. 2, an assembly procedure of the server 100 is shown. The nest 12 can be placed within the bottom chassis 6. The front cover 10 may also be connected to the bottom chassis. With the nest 12 in place, the internal electronics can be positioned within the chassis. This can include the storage drives 2, as well as other electronics such as a computer module 16 and the power connections 18 shown at the back of the chassis. As will be explained in more detail below, the nest 12 can receive and properly position storage drives 2 within the server 100. This becomes significant as the single controller pcba 4 designed to control the storage drives 2 also needs to connect to each of them. Thus, the electrical pins 20 and connectors 22 between them (FIG. 2A) have to be precisely positioned to line up to allow for quick and simple connection without damaging them. It will be understood that harnesses and wires can be used to simplify the connection process, but this can also increase the material cost and potentially decrease the amount of space available in the server for other components and/or block air flow through the server. Thus, as shown, an electrical pin 20 or connector 22 on the storage drive 2 can directly connect to a corresponding electrical pin 20 or connector 22 on the controller pcba 4. This can be done without the use of wires positioned between the electrical pins and connectors. The controller pcba can then be secured to the storage drives with the use of fasteners 24.

In the illustrated embodiment, only fourteen (14) storage drives 2 are shown, with one open space in the nest being illustrated. It will be noted that typically all spaces of the nest will be full, though some embodiments may have fewer than all spaces with a corresponding storage drive.

Once the controller pcba 4 is in place, a retaining cover 14 can be used to secure the storage drives 2 in the server 100 and then a chassis cover 8 can be secured in place as shown in FIG. 2.

Moving now to FIGS. 3-8, a low cost and improved air flow management scheme is described. The air flow management scheme can be used to provide air flow around each drive in a densely packed server chassis, as well as other styles of servers and computers. It can also be used for cooling within other types of electronic devices, to cool other types of electronic components, not limited to storage drives.

Figure 3:
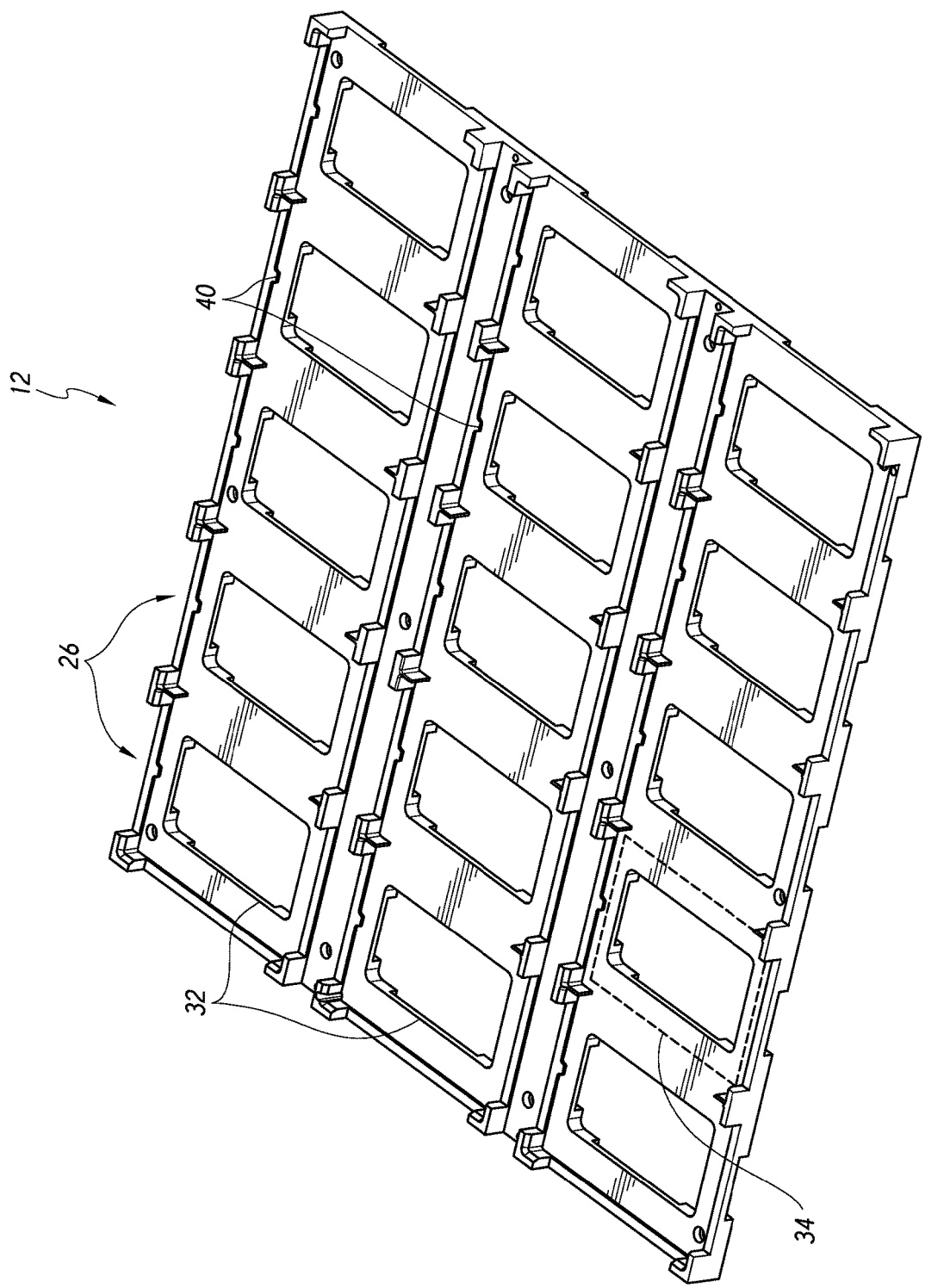
FIG. 3 is a perspective view of a nest configured to receive and properly position storage drives within the server.
Figure 4:
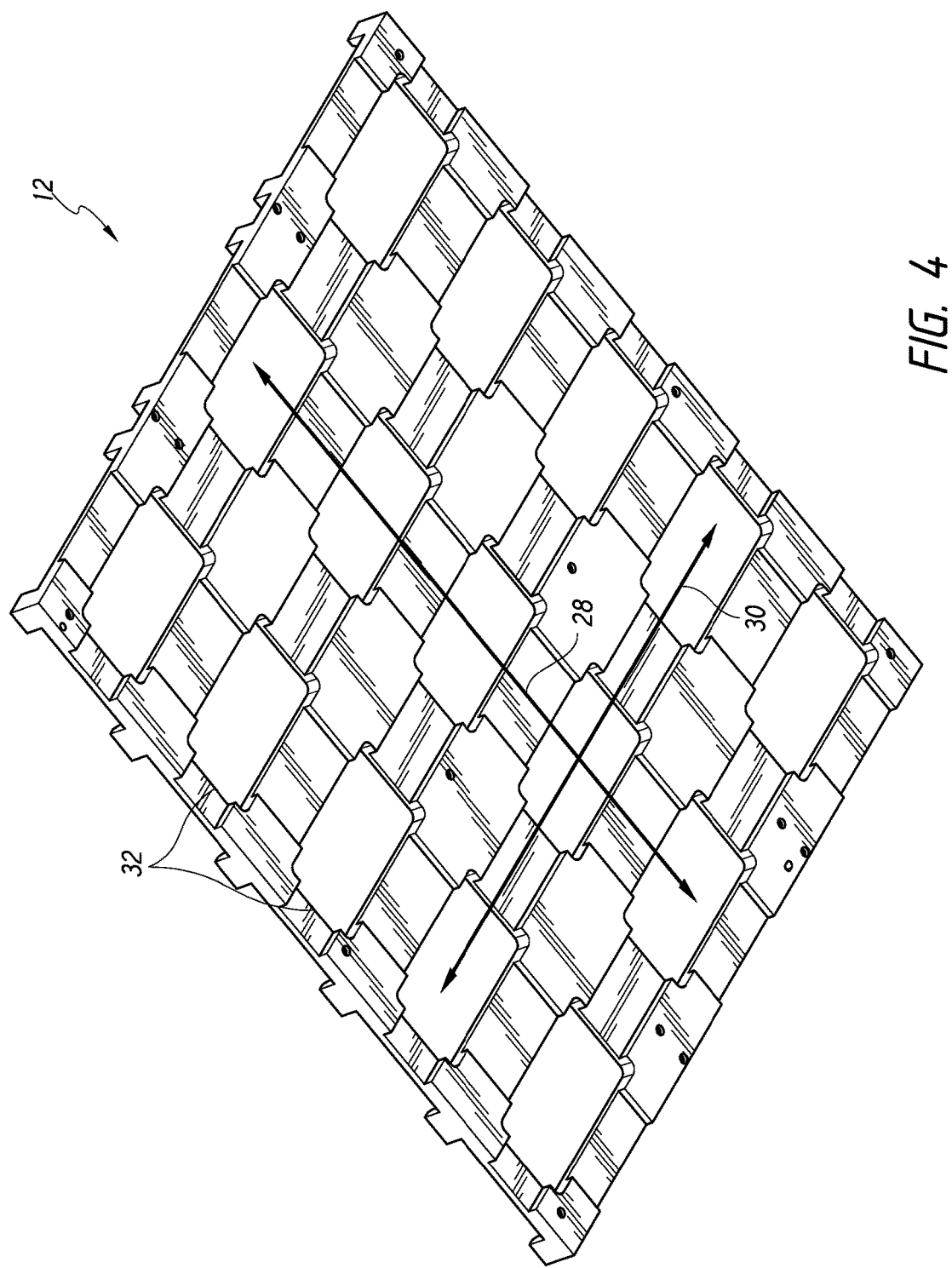
FIG. 4 is a bottom perspective view of the nest illustrating the cooling channels.

In FIGS. 3 and 4, perspective views of a nest 12 configured to receive and properly position storage drives 2 within the server 100 are shown. The nest 12 can include a plurality of storage drive receiving areas or bays 26. Each storage drive receiving area 26 can be configured to receive a corresponding storage drive 2. As shown, the nest 12 includes fifteen (15) storage drive receiving areas 26. Any number of storage drive receiving areas can be used based on the desired storage density and capacity of the server, among other considerations.

In FIG. 4, cooling channels 28, 30 (e.g., air channels) in the bottom of the nest can be seen. The server can be designed to allow for air flow around the storage drives, such as under and above the storage drives. As shown, the nest can include main air channels 30 that extend from front to back. The main air channels 30 can be interconnected with side channels 28 that extend from side to side. As illustrated, the nest includes five (5) main air channels 30 and three (3) side channels 28. The number of main and side air channels can correspond with the number of rows and columns of storage drive receiving areas 26 to maximize cooling of each storage drive 2. In some embodiments, the nest can include main channels 30 without side channels 28 or include side channels 28 without main channels 30. For example, if the server as disclosed herein incorporates a fan for forced air convection cooling, then the nest may include a certain number of main channels 30 without side channels 28 while achieving desired cooling of the servers by directing the forced air through the main channels 30 and minimizing air leakage that may occur through the side channels 28 when air is moved by a fan from one side to another of the server.

The nest 12 also has large cutouts 32 at each storage drive receiving area 26. This can increase the cooling of each storage drive as more of its surface area is exposed and can be cooled through air flow.

The cutouts 32 can create an air passageway to allow a flow of air to access the bottom of a storage drive 2.

Channeling air directly to the bottom of the storage drive 2 can increase cooling in an efficient matter.

According to some embodiments, the cutout 32 can have a footprint on the nest 12 smaller than a footprint 34 of the storage drive 2 on the nest (see FIG. 3). This can help ensure proper air flow through the cutout when a storage drive is positioned at the storage drive receiving area. In some embodiments, the storage drive can close or prevent access to the cutout from a top of the nest. In some embodiments, the storage drive can effectively seal off access to the top of the cutout. In other embodiments, air can flow into and out of the cutout from both the top and bottom of the nest. Though, it will be understood that preferably, the primary air flow into and out of the cutout comes from under the nest as discussed herein.

Figure 5:
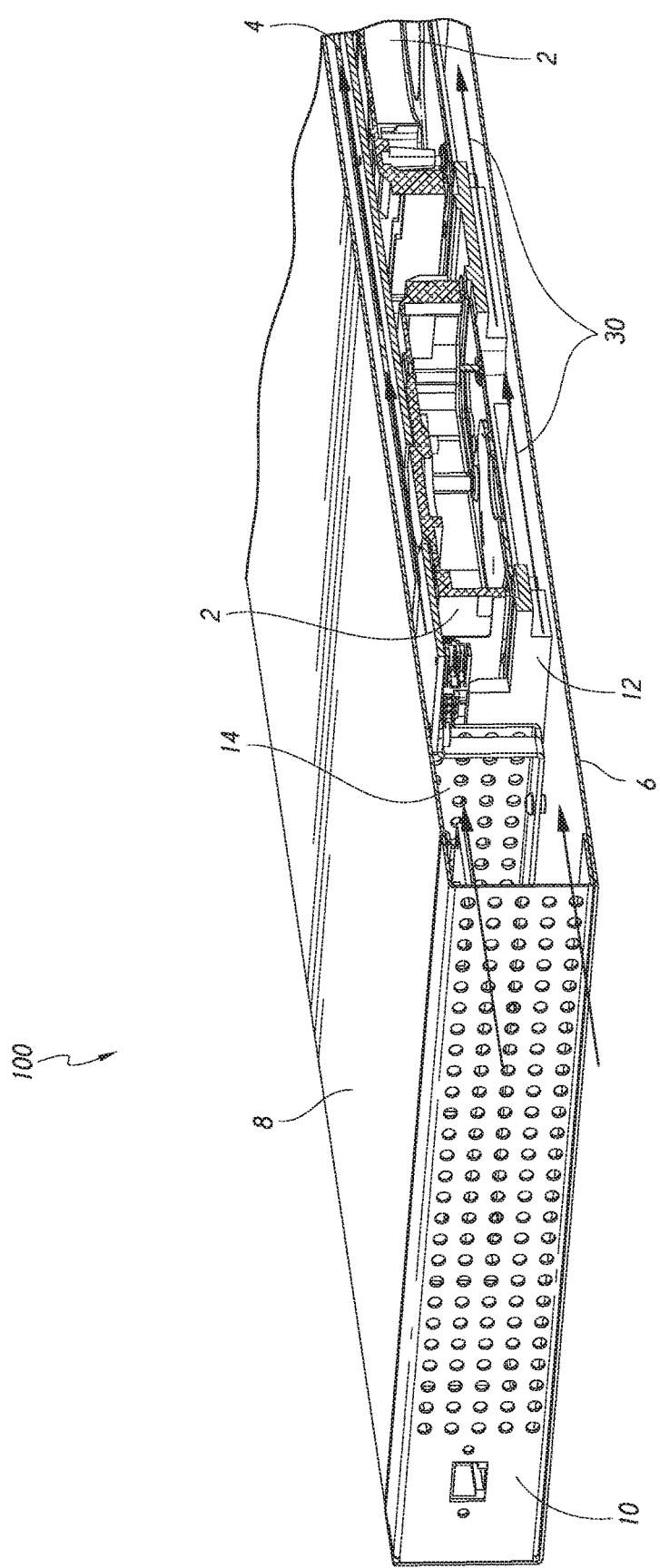
FIGS. 5 and 6 are cross-sectional views of the server with a schematic representation of air flow through the server.
Figure 6:
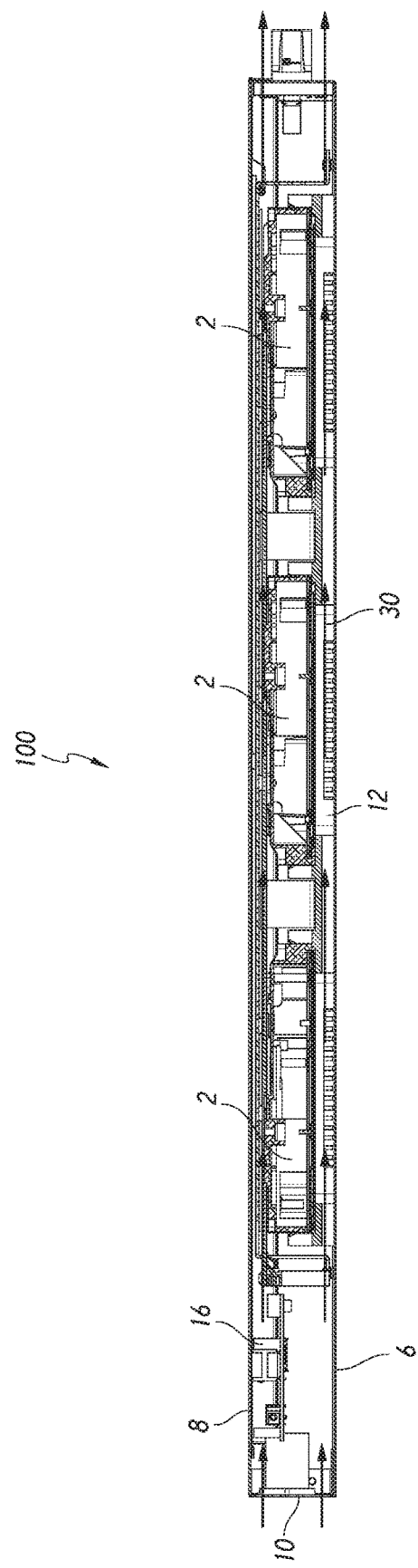

A nest 12 can be used to form a bottom of one or more of the storage drive receiving areas 26. The nest can be positioned between the top 8 and bottom 6 of the chassis enclosure and establish an air channel between the nest and the bottom surface of the chassis. For example, an air channel 28, 30 can be formed in the bottom of the nest. The nest can be placed on the bottom surface of the chassis to establish air channels on the bottom of the server as shown in FIGS. 5 and 6. It will be understood that the nest can also connect to the chassis in other ways to create an air channel.

Figure 7:
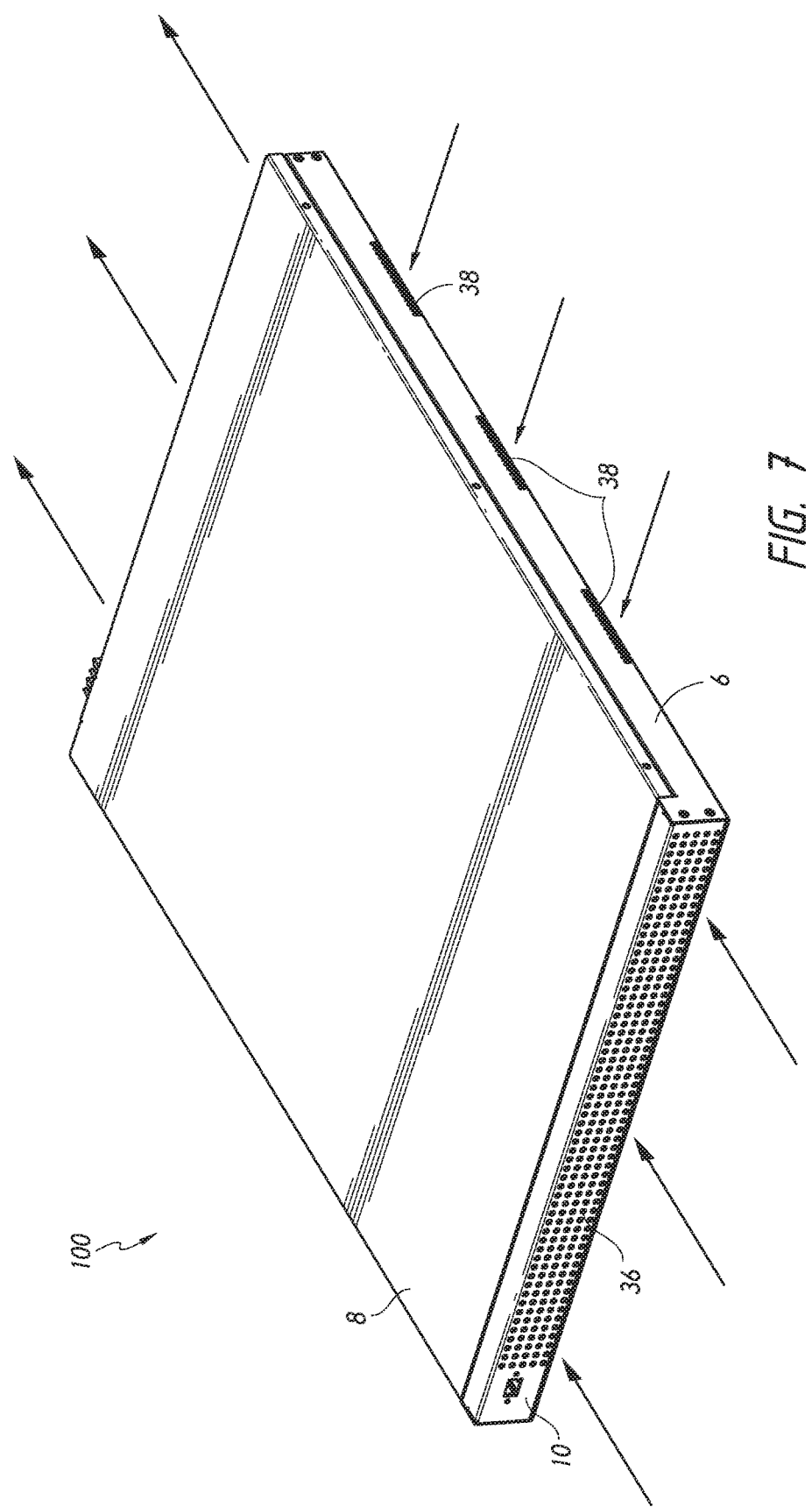
FIGS. 7 and 8 show some of the airflow entry points on the server.
Figure 8:
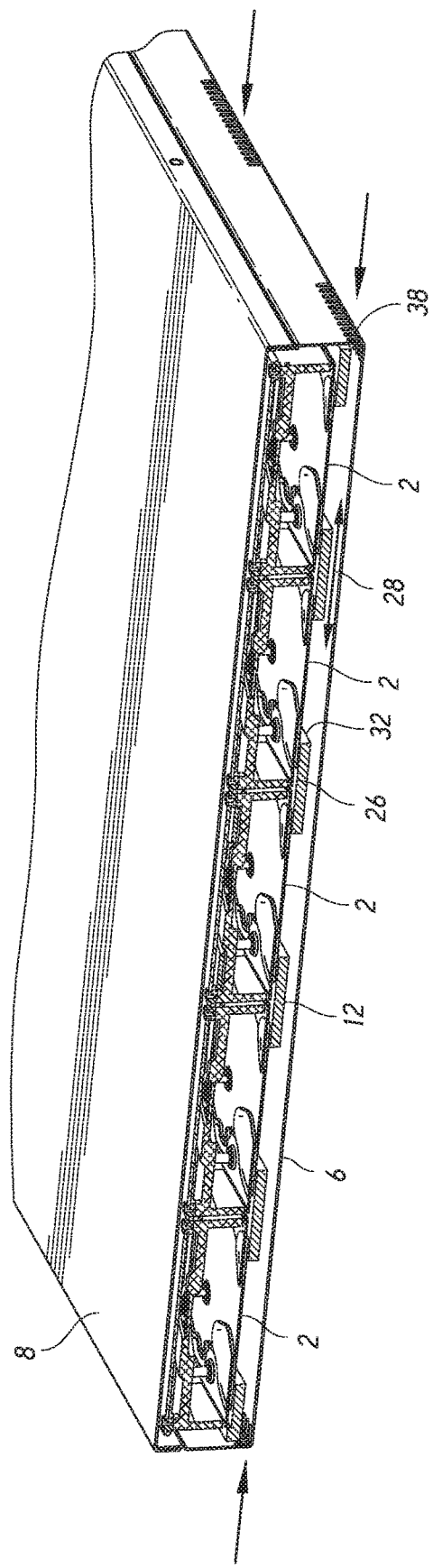

FIGS. 7 and 8 show some of the airflow entry and exit points or openings 36, 38 of the server. Air flow cooling paths (represented by arrows) show air flowing into the front grill 36 and the side ventilation holes 38 to the back of the server. As the illustrated embodiment does not include a cooling fan, the air flow will be controlled by other sources outside of the server and can have other flow paths through the server. The server design as shown is optimized for natural convection cooling.

Air can flow above and below the storage drives 2 and storage drive receiving areas 26. As will be described in more detail below, the retaining cover 14 can be positioned above the storage drives 2 to allow air flow therebetween. The chassis cover 8 can also be positioned above the retaining cover 14 to allow air flow between the two covers. It will be understood that, in some embodiments, the retaining cover 14 can directly contact the storage drives 2 so that little to no air can effectively flow between them. The relationship between the retaining cover 14 and chassis cover 8 can be positioned likewise.

In some embodiments, the server chassis can be size efficient per the type of storage drive. Thus, even with the air channels, a height of the server chassis defined by the distance from the top wall to the bottom wall of the enclosure can be less than two times a height of a storage drive to be received within the enclosure. In other embodiments, it can be less than 1.5, 1.6, 1.7, 1.8, or 1.9 times. Put another way, the height of the storage drive can be 40%, 50%, 60%, 70%, 80%, or 90% of the height of the enclosure. In some embodiments, the height of the storage drive can be between 40% and 80%, 50% and 70%, 55% and 65% of the height of the enclosure.

Turning now to FIGS. 9-13, the positioning of the storage drives 2 within the server will now be described. FIG. 9 shows a top perspective view of a partially disassembled server illustrating the arrangement of storage drives 2 within the server chassis. As can be seen, in some embodiments, the storage drives 2 can be organized in rows and columns. The storage drives can face the same direction or different directions. As shown, the first row of storage drives 2 faces a different direction than the second and third row of storage drives, as represented by the arrows.

FIGS. 10A and 10B illustrate a number of datums of the nest (e.g., points of contact with features, sections, portions, or parts of the nest) (see also FIG. 3). The nest receives and positions storage drives within the server. As has been mentioned, using a single controller pcba to control the storage drives will include the storage drives connected to the single controller pcba. Controlling the accuracy of the size and placement of the datums in the nest can help control the connection of the single controller pcba to multiple storage drives. Thus, the electrical pins and connectors between them can be precisely positioned to line up to allow for quick and simple connection without damaging the connections. An electrical pin or connector on the storage drive 2 can directly connect to a corresponding electrical pin or connector on the controller pcba 4. This can be done without the use of wires positioned between the electrical pins and connectors.

In the illustrated storage drive receiving area 26, there are a number of datums 40, 41, 42, 43, 44, 46, 48, 50, 52 used to control the positioning of the storage drive. The datums can be used to position the storage drive in one or both of the X and Y axes as also illustrated in FIGS. 10A and 10B. Thus, datums 41, 42, 43, 44 can position the storage drive along the Y axis, while datums 46, 48, 50, 52 can position the storage drive along the X axis. The datums 41, 42, 43, 44, 46, 48, 50, 52 extend along the Z axis as illustrated to, for example, at least partially define the receiving area 26 and position the storage drives as desired. In some embodiments, each storage drive receiving area in a row of the nest can use datums that are aligned along the row. Thus for example, each storage drive receiving area can have three datums that are in the same relative location to the other storage drive receiving areas in the row. It will also be understood that this may be the case for all of the storage drive receiving areas in the nest, but certain sections, such as entire rows, may have different datums as compared to other sections. It will be understood that more or fewer datums can be used to position a storage drive within the storage drive receiving area 26. In some embodiments, five or more datums are used (two or more for the X axis and two or more for the Y axis).

The datums can be used to position the storage drive in the Z axis as illustrated in FIGS. 10A and 10B (see also FIG. 3). Datums 40, 45, 47 can position the storage drive in the Z axis. For example, datums 40, 45, 47 can determine where along the Z axis the storage drive is situated in the receiving area 26. While three datums 40, 45, 47 are used the establish the plane up to which a surface (e.g., bottom surface) of the storage drive is positioned along the Z axis, any number of datums can be used to position the storage drive along the Z axis, such as four or more. As illustrated, datums 40, 45, 47 extend along the X and Y axes into the receiving area 26 to elevate the storage drive above surfaces of the nest 12 circumscribing the cutout 32.

Once the controller pcba 4 is in place on the storage drives 2, with the pins and connectors connected, screws or other fasteners can be used to secure the controller pcba in place. In some embodiments, 7 to 10 screws are used to connect each storage drive to the controller pcba. The screws can help ensure that the storage drives and controller pcba stay properly aligned.

With the controller pcba 4 in place, a retaining cover 14 can be used to secure the storage drives and controller pcba in the server. FIGS. 11-13B show the securement of the storage drives 2 within the server 100, as well as the spacing for airflow above the storage drives.

Figure 11:
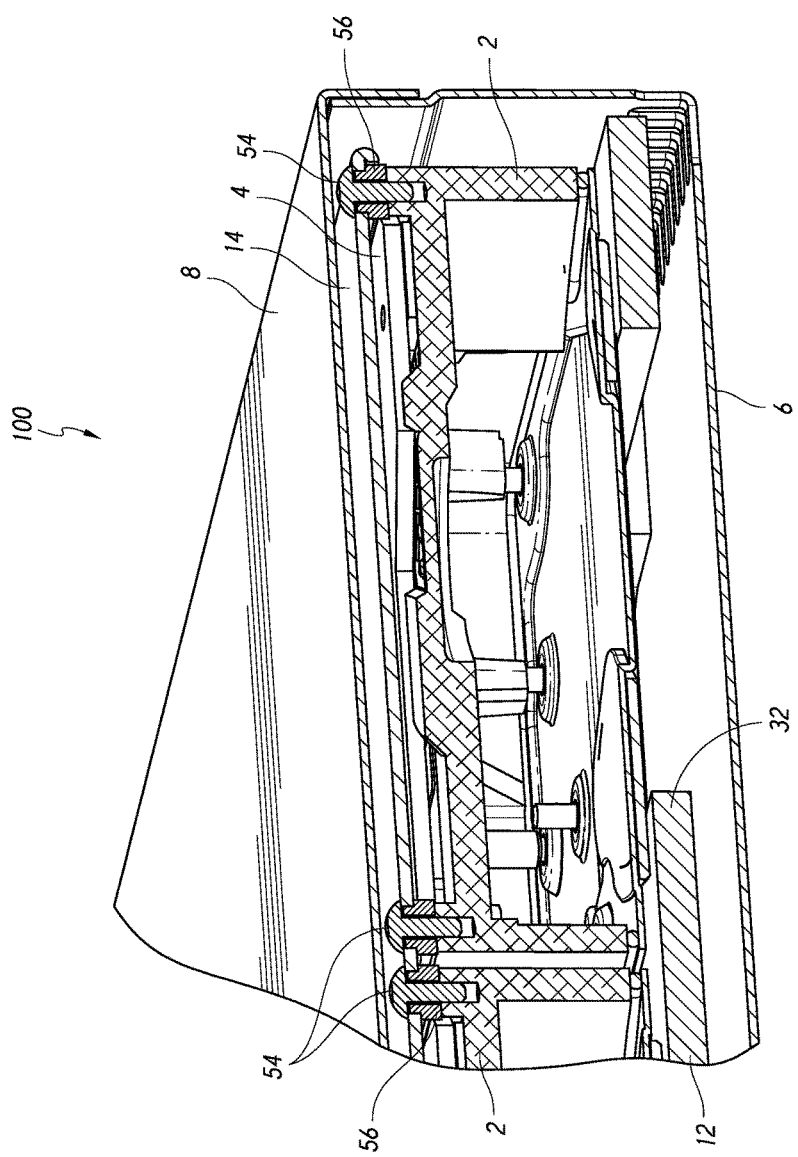
FIG. 11 shows the securement of the storage drives within the server, as well as the spacing for airflow above the storage drives.

In FIG. 11, the cross-section of the server shows the mounting arrangement of the storage drive. A fastener 54, such as a screw 54, secures the retaining cover 14 to the storage drives 2. The fastener 54 may also secure the retaining cover 14 to the controller pcba 4. The fastener 54 may also secure the retaining cover 14 to the controller pcba 4 and the storage drives 2. In the illustrated embodiment, spacers 56 are also provided to maintain a space between the bottom of the retaining cover and the top of the controller pcba. This can allow air to flow through the space to help with cooling. The spacers 56 can be conductive to help transfer heat from the storage drives 2 and/or controller pcba 4 to the retaining cover 14. The large surface area of the retaining cover can help to more quickly dissipate heat. In some embodiments, the retaining cover and the spacers can be made of metal. The controller pcba can include a copper or other conductive trace where the spacer contacts the controller pcba. The controller pcba can also include copper or other conductive traces that contact conductive surfaces of the storage drive. Thus, heat can be transferred from the storage drive to the controller pcba, then to the spacer, and then to the retaining cover. The fastener can also be used to transfer heat from the storage drive to the retaining cover. In some embodiments, the heat can be further transferred to the chassis cover. In some embodiments, the retaining cover can contact the controller pcba and/or storage drives without the need for spacers. In some embodiments, the retaining cover can include embossing to create dimples for contact with the controller pcba while still allowing for airflow between the controller pcba and the retaining cover.

In some embodiments, the air space between the pcba and the retaining cover can be larger than the thickness of the controller pcba, such as twice as thick.

Figure 12:
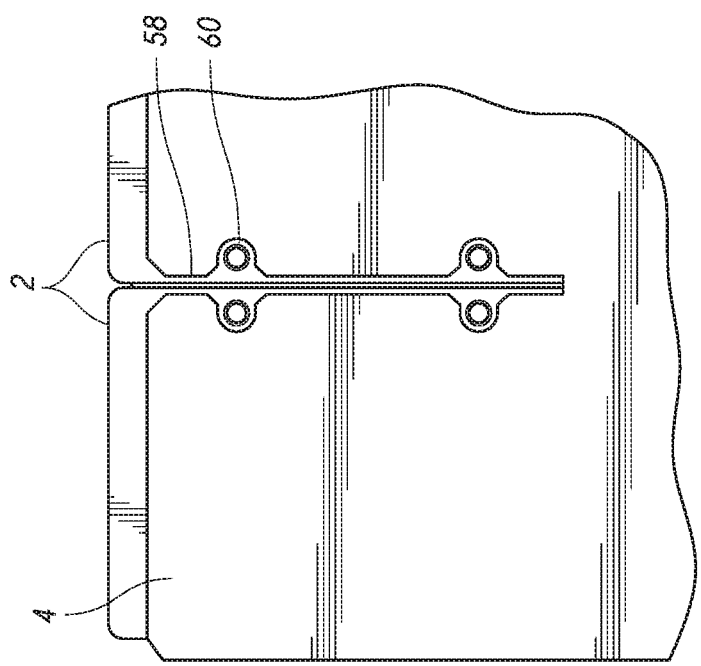
FIG. 12 is a detail view of the printed circuit board and storage drives.
Figure 13:
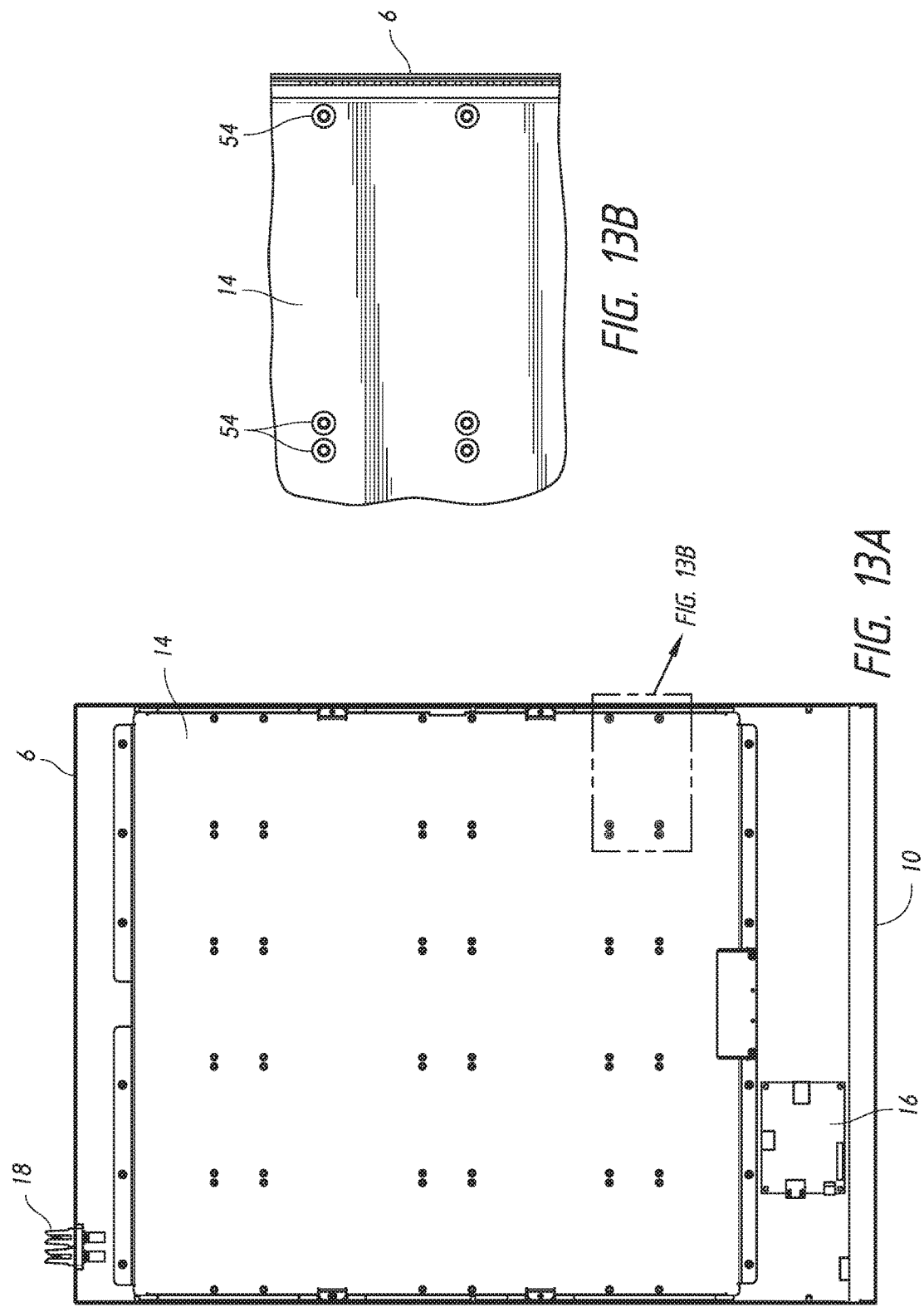

Looking now to FIG. 12, in some embodiments, the controller pcba 4 can include a cutout 58. The cutout 58 can allow the spacers 56 to directly contact the storage drives 2 without contacting the controller pcba, or without having the controller pcba being between the storage drive and the spacer. It is typical for a storage drive 2, such as a disk drive, to include a metal frame 60. The spacers 56 can contact the metal frame 60 with the fasteners 54 threadedly received into the metal frame 60. The metal frame 60 can also establish a datum plane. Thus, the spacers 56 in contact with the datum plane of the storage drive can provide a consistent space between the storage drives 2 and the retaining cover 14.

Any number of fasteners 54 can be used to secure the storage drives 2 and retaining cover 14. In the illustrated embodiment, four (4) fasteners 54 are used to secure each storage drive 2 to the retaining cover. Looking to FIG. 13A and to the corresponding detail view of FIG. 13B, six (6) fasteners 54 are shown. The four (4) fasteners on the right side can be used to secure a single storage drive and the two (2) additional fasteners 54 on the left can be used to secure a second storage drive.

Figure 14:
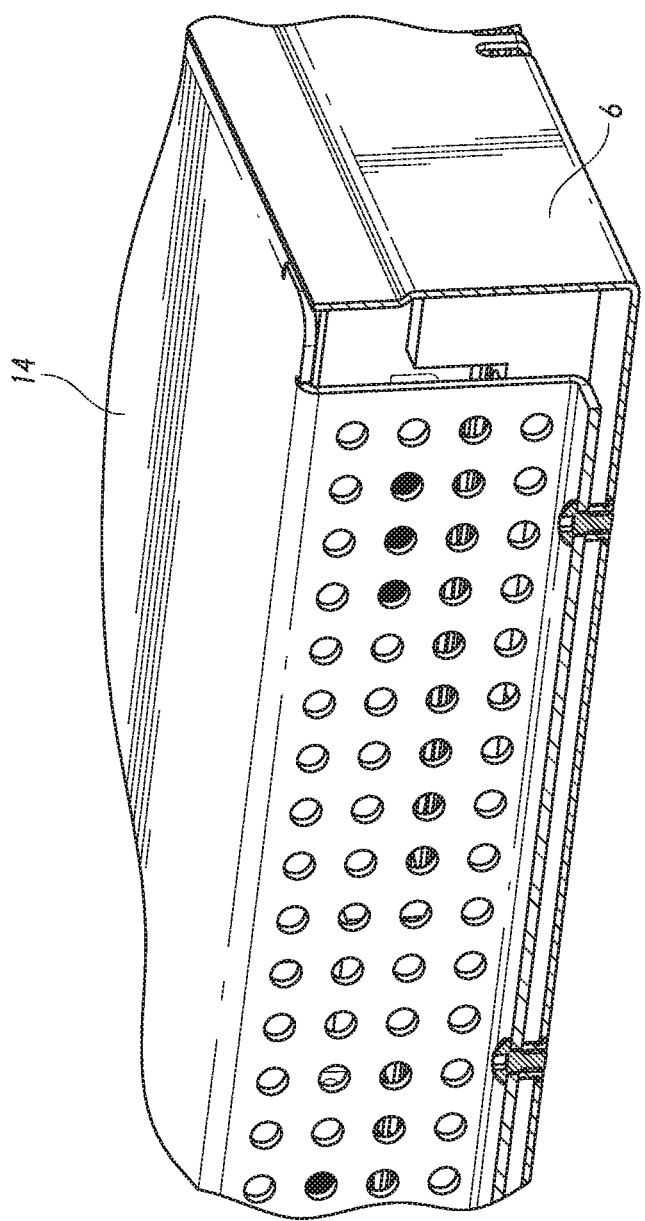

As shown in FIGS. 13A and 14, the storage drive retaining cover 14 can be secured to the chassis 6. The chassis cover 8 can then be secured in place. The storage drive retaining cover 14 is shown with attachment points at the rear, sides, and front, though it will be understood that more or fewer attachment points can be used.

As discussed herein, a chassis architecture can be a high density server to accommodate eight, twelve, fifteen, sixteen, twenty, or a different number of storage drives such as disk drives. Among other benefits, the server can provide for drive attachment and clamping, drive registration and alignment, drive cooling, controller size optimization and disk drive arrangement inside the chassis, and optimized natural convection cooling.

In some embodiments, a server can beneficially provide ultra-high density server capacity (e.g., 15 drives), highly integrated design (e.g., common controller), and optimized natural convection cooling.

In some embodiments, a mechanical chassis architecture can be used for a cold storage server comprising a 1U type form factor adhering to the Facebook Open Architecture Design Guidelines. The mechanical chassis architecture can comprise a nest for holding up to 15 bare drives, wherein the nest comprises a plurality of drive cooling channels residing on the underside of the nest, the mechanical chassis architecture further comprising rear, front, and side air flow paths to allow for natural convection cooling.

According to some embodiments, a server can comprise a chassis, a plurality of disk drives, a nest, a printed circuit board (pcb), a retaining cover, a plurality of fasteners and a plurality of spacers. The nest can be positioned within the chassis and having a plurality of bays, each disk drive of the plurality of disk drives positioned within one of the bays of the plurality of bays. The printed circuit board can be a single pcb that is physically and electrically connected to all of the disk drives of the plurality of disk drives. The retaining cover can secure the plurality of disk drives within the chassis. Each spacer of the plurality of spacers can be positioned on one of the fasteners of the plurality of fasteners, the spacers maintaining a gap between a top of the single printed circuit board and a bottom of the retaining cover, each spacer being in contact with a disk drive of the plurality of disk drives and the retainer cover so that heat may be transferred from the disk drive to the retainer cover.

In some embodiments, the nest comprises a plurality of air channels, and each bay of the plurality of bays comprises a cutout in fluid communication with at least one of the plurality of air channels to thereby provide cooling to a bottom of a disk drive. Each bay can include at least three (e.g., three, four, or more) datums configured to position the respective disk drive within the bay. The bays can be organized in rows and columns. According to some embodiments, in at least one pair of a first row adjacent a second row, the respective bays of the first row are mirror images of the bays of the second row.

The server can also include a plurality of electrical pins and connectors, each of the electrical pins being on the printed circuit board or one of the hard disk drives and connected to one of the electrical connectors on the other of the printed circuit board or one of the hard disk drives. The server may further be part of a data storage system with a plurality of the servers and a fan, wherein each server does not include a dedicated fan.

In some embodiments, a cold storage server can comprise a chassis, a plurality of hard disk drives, a nest, a printed circuit board, a retaining cover, a plurality of fasteners and a plurality of spacers. The nest is positioned within the chassis and having a plurality of bays, the bays being organized in rows and columns and each hard disk drive of the plurality of disk drives positioned within one of the bays of the plurality of bays. The pcb can be a single printed circuit board physically and electrically connected to all of the hard disk drives of the plurality of hard disk drives. The server can also include a plurality of electrical pins and connectors. Each of the electrical pins being on the printed circuit board or one of the hard disk drives and connected to one of the electrical connectors on the other of the printed circuit board or one of the hard disk drives. The retaining cover can secure the plurality of hard disk drives within the chassis. Each spacer of the plurality of spacers can be positioned on one of the fasteners of the plurality of fasteners, the spacers maintaining a gap between a top of the single printed circuit board and a bottom of the retaining cover, each spacer being in contact with a hard disk drive of the plurality of disk drives and the retainer cover so that heat may be transferred from the hard disk drive to the retainer cover.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

Similarly, this method of disclosure, is not to be interpreted as reflecting an intention that any claim require more features than are expressly recited in that claim. Rather, as the following claims reflect, inventive aspects lie in a combination of fewer than all features of any single foregoing disclosed embodiment. Thus, the claims following the Detailed Description are hereby expressly incorporated into this Detailed Description, with each claim standing on its own as a separate embodiment.

What is claimed is:

1. A cold storage server comprising:
   a chassis;
   a plurality of disk drives;
   a nest positioned within the chassis and having a plurality of bays, each disk drive of the plurality of disk drives positioned within one of the bays of the plurality of bays;
   a single printed circuit board physically and electrically connected to all of the disk drives of the plurality of disk drives;
   a retaining cover to secure the plurality of disk drives within the chassis;
   a plurality of fasteners; and
   a plurality of spacers, wherein:
      each spacer of the plurality of spacers is positioned on one of the fasteners of the plurality of fasteners;
      the spacers maintain a gap between a top of the single printed circuit board and a bottom of the retaining cover to dissipate heat; and
      each spacer is in contact with a disk drive of the plurality of disk drives and the retainer cover and configured to transfer heat from the disk drive to the retainer cover.

2. The server of claim 1, wherein:
   the nest comprises a plurality of air channels; and
   each bay of the plurality of bays comprises a cutout in fluid communication with at least one of the plurality of air channels to thereby provide cooling to a bottom of the respective disk drive.

3. The server of claim 1, wherein the single printed circuit board is positioned above the plurality of disk drives such that each of the plurality of disk drives is sandwiched between the single printed circuit board and the nest.

4. The server of claim 1, wherein:
   the server is a one rack unit (1U) server configured for cold storage of data; and
   the plurality of disk drives comprises fifteen (15) disk drives.

5. The server of claim 1, further comprising a computer module.

6. The server of claim 1, wherein each bay of the plurality of bays comprises at least three datums configured to position the respective disk drive within the bay.

7. The server of claim 1, wherein:
   the bays are organized in rows and columns; and
   in at least one pair of a first row adjacent a second row, the respective bays of the first row are mirror images of the bays of the second row.

8. The server of claim 7, wherein the nest comprises a plurality of air channels with one air channel corresponding with each row of bays and one air channel corresponding with each column of bays.

9. The server of claim 8, wherein:
   each bay of the plurality of bays comprises a cutout in fluid communication with the respective air channel corresponding with the row and the respective air channel corresponding with the column; and
   the cutout is configured to provide cooling to a bottom of the respective disk drive in the bay.

10. The server of claim 1, further comprising a plurality of electrical pins and connectors, each of the electrical pins being on the single printed circuit board or one of the disk drives and connected to one of the electrical connectors on the other of the single printed circuit board or one of the disk drives.

11. A data storage system comprising: a plurality of servers of claim 1, wherein each server does not include a dedicated fan.

12. A server comprising:
   a chassis;
   a plurality of hard disk drives;
   a nest positioned within the chassis and having a plurality of bays, the bays being organized in rows and columns and each hard disk drive of the plurality of hard disk drives positioned within one of the bays of the plurality of bays;
   a printed circuit board physically and electrically connected to the hard disk drives of the plurality of hard disk drives;
   a plurality of electrical pins and connectors, each of the electrical pins being on the printed circuit board or one of the hard disk drives and connected to one of the electrical connectors on the other of the printed circuit board or one of the hard disk drives;
   a retaining cover to secure the plurality of hard disk drives within the chassis; and
   a plurality of spacers maintaining a gap between a surface of the printed circuit board and a surface of the retaining cover, each spacer being in contact with a hard disk drive of the plurality of hard disk drives and the retainer cover and configured to transfer heat from the hard disk drive to the retainer cover.

13. The server of claim 12, wherein:
   the nest comprises a plurality of air channels; and
   at least some of the plurality of bays comprise a cutout in fluid communication with at least one of the plurality of air channels to thereby provide cooling to a surface of the respective hard disk drive.

14. The server of claim 12, wherein:
the server is a one rack unit (1U) server configured for cold storage of data; and
the plurality of hard disk drives comprises at least twelve (12) hard disk drives.

15. The server of claim 12, wherein each bay of the plurality of bays comprises at least three datums configured to position the respective hard disk drive within the bay.

16. The server of claim 12, wherein in at least one pair of a first row adjacent a second row, the respective bays of the first row are mirror images of the bays of the second row.

17. The server of claim 16, wherein the nest comprises a plurality of air channels with one air channel corresponding with each row of bays and one air channel corresponding with each column of bays.

18. The server of claim 17, wherein:
each bay of the plurality of bays comprises a cutout in fluid communication with the respective air channel corresponding with the row and the respective air channel corresponding with the column; and
the cutout is configured to provide cooling to a surface of the respective hard disk drive in the bay.

19. A data storage system comprising: a plurality of servers of claim 12, wherein each server does not include a dedicated fan.

20. The server of claim 12, wherein the printed circuit board is positioned above the plurality of hard disk drives such that each of the plurality of hard disk drives is sandwiched between the printed circuit board and the nest.

* * * * *